United States Patent
An et al.

(10) Patent No.: US 9,231,048 B2
(45) Date of Patent: Jan. 5, 2016

(54) CAPACITOR AND METHOD OF FORMING SAME

(71) Applicant: Taiwan Semiconductor Manufacturing Co., Ltd., Hsin-Chu (TW)

(72) Inventors: Chi-Di An, Hsin-Chu (TW);
Chien-Hung Chen, Taipei (TW);
Yu-Juan Chan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 46 days.

(21) Appl. No.: 13/929,834

(22) Filed: Jun. 28, 2013

(65) Prior Publication Data
US 2013/0292754 A1  Nov. 7, 2013

Related U.S. Application Data

(63) Continuation of application No. 13/221,419, filed on Aug. 30, 2011, now Pat. No. 8,497,540.

(51) Int. Cl.
*H01L 49/02* (2006.01)
*H01L 29/66* (2006.01)
*H01L 29/94* (2006.01)
*H01L 23/522* (2006.01)
*H01L 27/02* (2006.01)

(52) U.S. Cl.
CPC ............ *H01L 28/86* (2013.01); *H01L 23/5223* (2013.01); *H01L 28/60* (2013.01); *H01L 29/66181* (2013.01); *H01L 29/94* (2013.01); *H01L 27/0207* (2013.01); *H01L 2924/0002* (2013.01)

(58) Field of Classification Search
CPC .................................................. H01L 23/5223
USPC .......................................... 257/300, 301, 303
See application file for complete search history.

(56) References Cited

U.S. PATENT DOCUMENTS

| | | | | |
|---|---|---|---|---|
| 5,858,832 A | * | 1/1999 | Pan | H01L 28/40 257/E21.008 |
| 6,956,261 B2 | | 10/2005 | Shibata | |
| 2004/0041185 A1 | * | 3/2004 | Ireland | H01L 21/76897 257/296 |
| 2008/0006868 A1 | * | 1/2008 | Hsu et al. | 257/314 |
| 2009/0090951 A1 | * | 4/2009 | Chang et al. | 257/306 |
| 2011/0309420 A1 | * | 12/2011 | Chang | H01L 23/5223 257/312 |

* cited by examiner

*Primary Examiner* — Mark Tornow
(74) *Attorney, Agent, or Firm* — Duane Morris LLP

(57) ABSTRACT

A device comprises a substrate having at least one active region, an insulating layer above the substrate, and an electrode in a gate electrode layer above the insulating layer, forming a metal-oxide-semiconductor (MOS) capacitor. A first contact layer is provided on the electrode, having an elongated first pattern extending in a first direction parallel to the electrode. A contact structure contacts the substrate. The contact structure has an elongated second pattern extending parallel to the first pattern. A dielectric material is provided between the first and second patterns, so that the first and second patterns and dielectric material form a side-wall capacitor connected in parallel to the MOS capacitor.

19 Claims, 5 Drawing Sheets

CAPACITOR AND METHOD OF FORMING SAME

This application is a continuation of U.S. patent application Ser. No. 13/221,419, filed Aug. 30, 2011, which is incorporated by reference herein in its entirety.

FIELD

This disclosure relates generally to semiconductor fabrication, and more specifically to formation of capacitors.

BACKGROUND

Metal-oxide-semiconductor (MOS) capacitors are frequently formed as part of the complementary metal oxide semiconductor (CMOS) process. In a CMOS process, transistors are typically formed by providing an active area with doped source/drain regions in the substrate, a gate insulating layer over the substrate, and a gate electrode over the gate insulating layer. Contacts (e.g., tungsten) connect the source/drain regions and gate electrode with a conductive interconnect structure having several horizontal conductive pattern layers (typically referred to as M1, M2, etc.) and vertical via layers formed within a plurality of inter-metal dielectric (IMD) layers.

For integrating the MOS capacitor fabrication into the same process, the top electrode of the MOS capacitor is formed as part of the gate dielectric layer. The capacitor dielectric is formed as part of the gate insulation layer. The anode contact of the capacitor is formed on the top electrode of the capacitor. A cathode contact connects to the source/drain and bulk substrate.

As transistor dimensions (including gate insulation layer thickness) shrink, leakage becomes a problem, and the gate insulation layer becomes more vulnerable to breakdown. To reduce leakage in advanced, smaller transistors, high-k metal gate structures have been considered. The traditional silicon dioxide gate insulating layer is replaced with a relatively thicker layer of a high-k dielectric material, such as hafnium silicate, zirconium silicate, hafnium dioxide or zirconium dioxide. The polycrystalline silicon gate electrode material is replaced with a metal, such as titanium nitride, tantalum nitride, or aluminum nitride.

Advanced methods of fabricating MOS capacitors, which are compatible with a high-k metal gate process, are desired.

DETAILED DESCRIPTION

Figure 1:
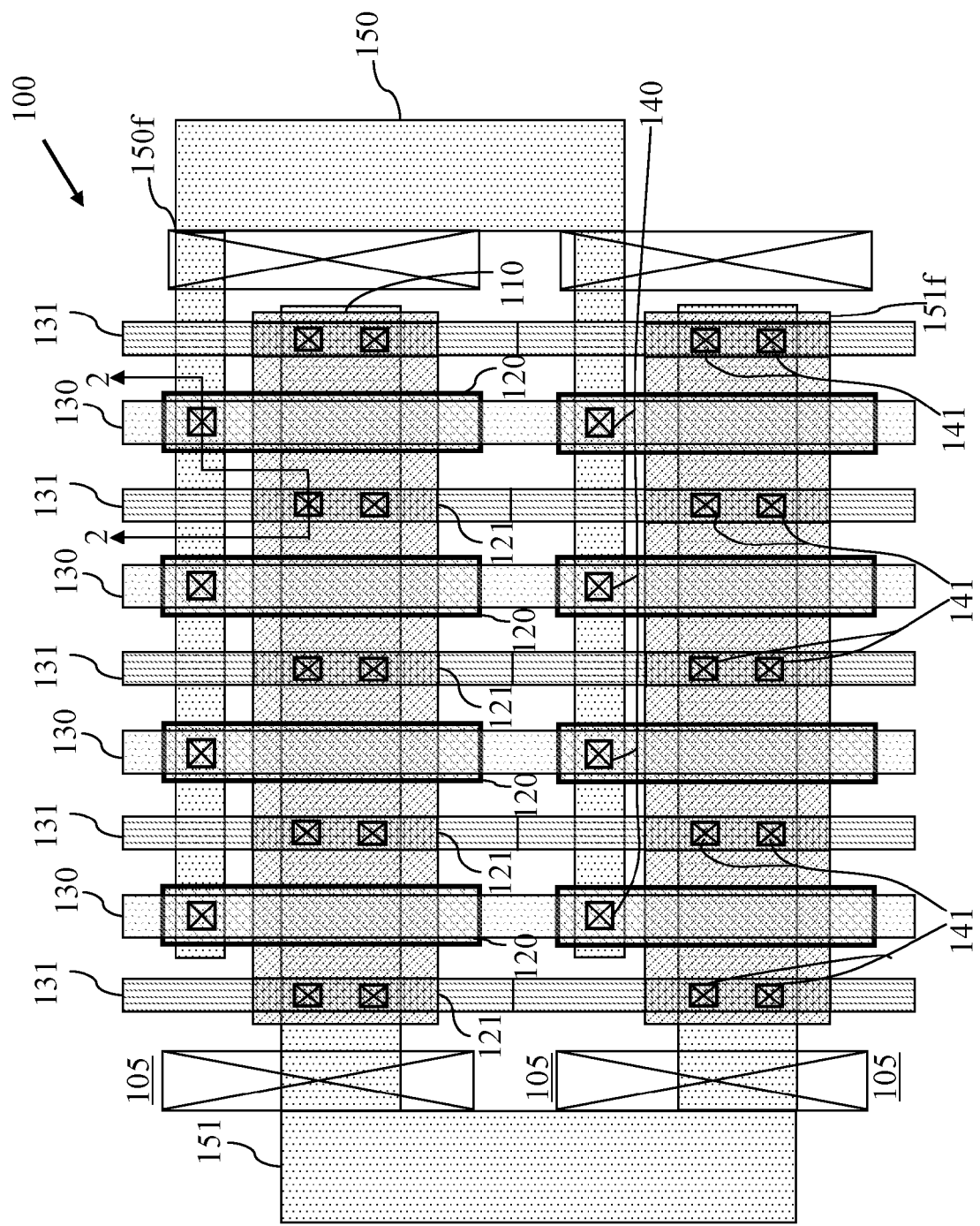
FIG. 1 is a plan view of a first embodiment of MOS capacitor structure having an integrated metal-oxide-metal capacitor.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Like items in different figures are indicated by like reference numerals.

The inventors have discovered that new capacitor structures should be adapted for use in semiconductor fabrication processes using a high-k metal gate structure. When a high-k metal gate structure is used, subsequent chemical mechanical polishing (CMP) steps are affected by the area density of the gate electrode material. (The area density of the gate electrode material refers to the fraction of the gate electrode layer occupied by the gate electrode patterns). As a result, the inventors have found it advantageous to reduce the area density of the high-k metal gate electrode layer. However, for a MOS capacitor, the total capacitance is proportional to the area of the capacitor top electrode (which equals the area of the capacitor dielectric layer). If the area of the top electrode is to be reduced to avoid gate area density problems in the subsequent CMP step, the capacitance is reduced accordingly. The inventors have found a structure which allows reduction of the area density of the gate electrode material, while substantially maintaining the total capacitance of the capacitor.

Although the methods are discussed below for examples using a high-k metal gate process, in other embodiments the methods described below may be used for a silicon oxide gate insulation layer (and capacitor insulation layer).

Figure 2:
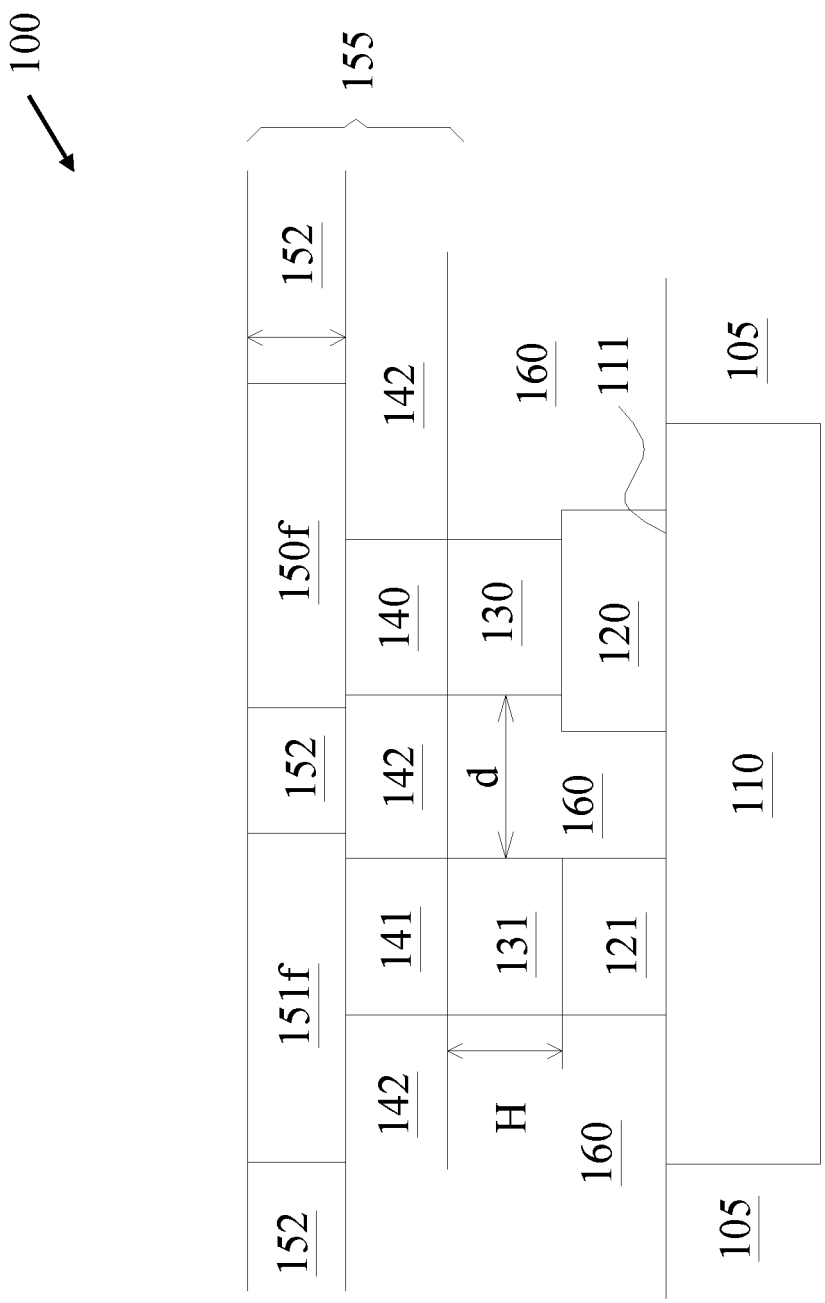
FIG. 2 is an enlarged cross sectional view taken along section line 2-2 of FIG. 1.
Figure 3:
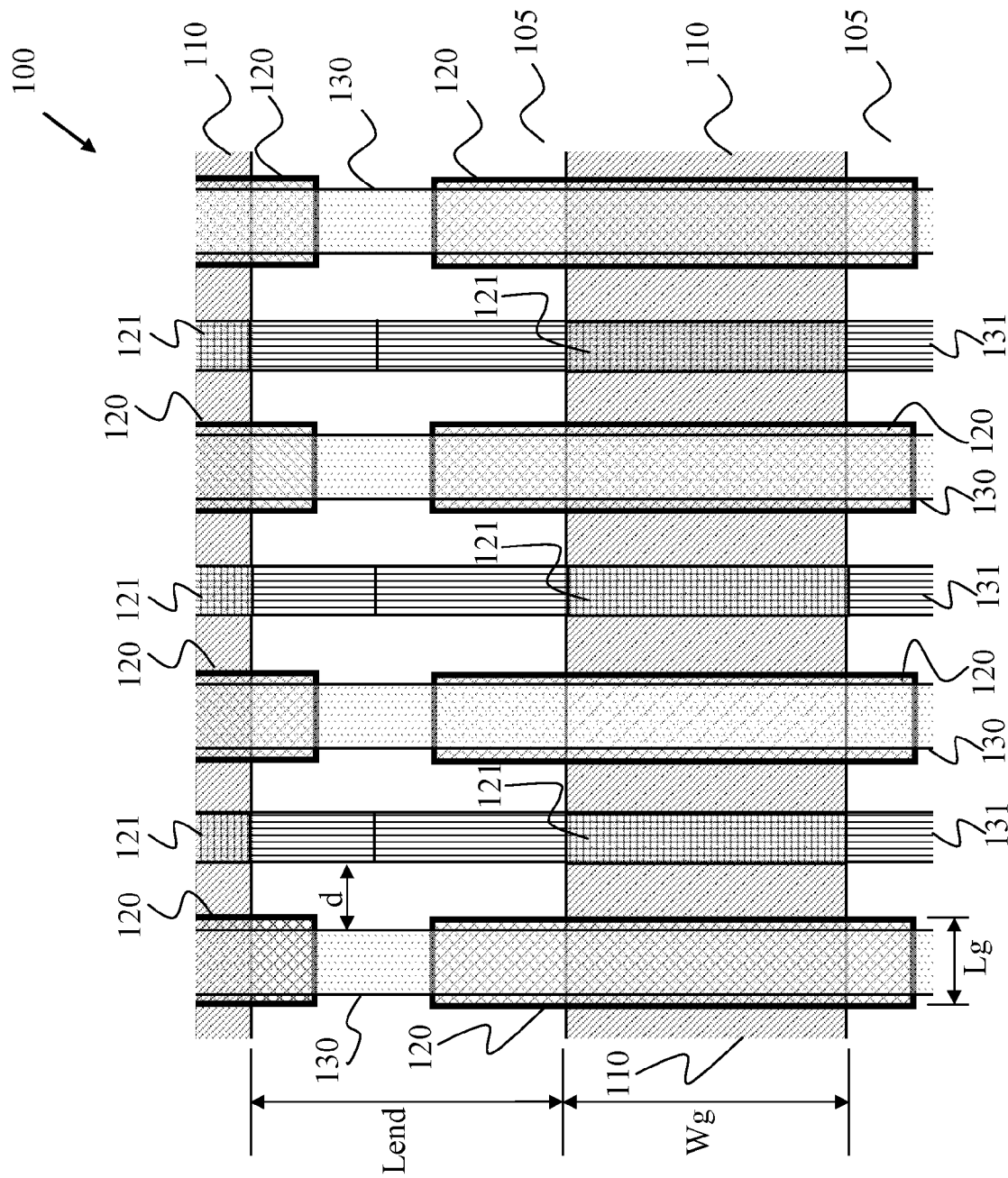
FIG. 3 is an enlarged plan view of the capacitor of FIG. 1, from which the via and M1 layers are omitted for ease of viewing the remaining underlying layers.

FIGS. 1-3 show a first embodiment of a MOS capacitor structure 100 having an integrated metal-oxide-metal (MOM) capacitor. As used herein, the term "metal-oxide-metal capacitor" is not limited to configurations in which the capacitor dielectric is a silicon oxide, and broadly encompasses the use of other dielectric materials for the MOM capacitor dielectric, as such materials are integrated into semiconductor fabrication in various present and future technology nodes, such as, but not limited to, low-k dielectrics and extreme low-k dielectrics.

A substrate 100 is provided having at least one active region 110, and at least one isolation region, such as shallow trench isolation regions 105. The substrate 100 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments. The active regions 110 are provided by doping a region of the bulk substrate 100 with impurities.

An insulating layer 111 is provided above the active region 110 of the substrate.

In some embodiments, the insulating layer 111 is the same layer used for forming the gate insulating layer of transistors on the same substrate 100. In some embodiments, the insulating layer 111 comprises a high-K dielectric 111, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer 111 may include a binary or ternary high-k film such as HfO, LaO, AlO, ZrO, TiO, Ta 2 O 5, Y 2 O 3, STO, BTO, BaZrO, HfZrO, HfLaO, HfTaO, HfTiO, combinations thereof, or other suitable materials. Alternatively, the high-k dielectric layer 111 may optionally include a silicate such as HfSiO, LaSiO, AlSiO, combinations thereof. The insulating layer 111 may be deposited using atomic layer deposition. In other embodiments, which do not use a high-k metal gate process, the structure and technique described herein may be used in a process employing a silicon oxide gate insulating layer.

The top electrode 120 may be a metal or alloy, such as but not limited to, titanium nitride, tantalum nitride, or aluminum nitride. In other embodiments which do not use a high-k metal gate process, the top electrode may be polycrystalline silicon. FIGS. 1 and 3 show a plurality of top electrodes 120 arranged in parallel with each other, and connected to each other by vertical conductive vias 140 in via layers 142 and an interconnect pattern 150f of one of the conductive pattern (line) layers 152 of the interconnect structure 155.

Thus, the top electrode 120, insulation layer 111 and the bulk substrate 110 form a metal-oxide-semiconductor (MOS) capacitor. In FIG. 1, a plurality of capacitance elements (one per electrode 120) are connected in parallel to each other, multiplying the total capacitance by the number of such capacitance elements.

A first contact layer 130 is formed directly on the top electrode 120. The first layer 130, also referred to herein as M0-PO or M0-Poly has elongated first patterns extending in a first (vertical) direction.

A contact structure 121, 131 directly contacts the substrate 110. The contact structure 121, 131 has an elongated contact portion 121 (shown in FIG. 2) and an elongated second pattern 131 extending parallel to the first patterns 130. The contact portion 121 of the contact structure 121, 131 are also referred to herein as M0-OD1 (121) and the second patterns 131 are also referred to as M0-OD2 (131). The contact portion 121 directly contacts the substrate 110 with ohmic contact.

Although the example includes an elongated contact M0 OD1 121, in other embodiments, the contact portion 121 of the contact structure may have another configuration. For example, the contact portion may include one or more square contacts connecting the elongated M0 OD2 pattern 131 to the substrate.

An ohmic contact is a region formed so that the current-voltage (I-V) curve of the device is linear and symmetric. The contact portion 121 may be a sputtered or evaporated metal pad patterned using photolithography, to provide low-resistance, and stability for the performance and reliability. A high doping of the active region 110 would narrow the depletion region at the interface and allow electrons to flow in both directions easily at any potential by tunneling through the barrier. For a silicon substrate, examples of suitable contact materials for contact portion 121 include W, Al, Al—Si, TiSi$_2$, TiN, MoSi$_2$, PtSi, CoSi$_2$, WSi$_2$.

The contact portion 121 is elongated and extends parallel to the electrode 120. In some embodiments, the contact portion 121 has a length substantially the same as a width of the active region 110, but this is not a requirement. The contact portion 121 may be shorter than the width of the active region 110.

A first contact layer 130 (M0-PO) is provided having a first portion directly on the top electrode 120, and a second portion extending beyond the top electrode 120, parallel to the plane of the substrate 110 (as shown in FIGS. 1 and 3). The first contact layer 130 has an elongated first pattern extending in a first direction parallel to the electrode 120. The first contact layer 130 is at the contact level, abutting the top electrode 120.

The elongated second pattern 131 of the contact structure extends parallel to the first pattern 130. In the examples of FIGS. 1-3, the first patterns 130 and second patterns are the same length as each other, have the same height as each other, and are positioned at the same level (with respect to the top surface of the active region 110 of the substrate). The first pattern and second pattern have a length at least as long as a sum of a width of the active region and a width of the STI region. Also, in the examples, a horizontal line that is normal to the end of the first patterns 130 intersects the end of the second patterns 131. In other words, the first patterns 130 and second patterns 131 are adjacent to each other throughout their length. In some embodiments, the first and second patterns 130, 131 have a length that is more than twice the sum of a width of the active region and a width of the STI region. The second pattern 131 is at the contact level, abutting the M0 OD1 contact 121.

In some embodiments, the first patterns 130 and second patterns 131 are formed of copper using a single damascene process. In alternative embodiments, the first patterns 130 and second patterns 131 may be formed of one or more of the group consisting of W, Al, Al—Si, TiSi$_2$, TiN, MoSi$_2$, PtSi, CoSi$_2$, WSi$_2$., using a process suitable for forming a contact, such as sputtering or chemical vapor deposition.

In one embodiment, the electrode 120 comprises a metal material, the contact portion 121 comprises tungsten, the first contact layer 130 comprises one of the group consisting of copper and tungsten, and the second patterns 131 comprise copper.

A dielectric material 160 is provided between the first patterns 130 and second patterns 131, so that the first and second patterns 130, 131 and dielectric material 160 form a MOM side-wall capacitor connected in parallel to the MOS capacitor. The dielectric material may be a silicon oxide, a silicon nitride, silicon oxy-nitride, low-k dielectric, or ELK material.

The substrate further comprises an interconnect structure 155 including a plurality of interconnect pattern (line) layers 152 having conductive patterns 150f, 151f therein, and a plurality of vertical via layers 142, having conductive vertical vias 140, 141 formed therein. The interconnect structure 155 may be formed by a damascene process, in which layers of inter-metal dielectric (IMD) material are deposited, trenches and vias are formed and filled with conductive material (e.g., copper), and the surface is planarized by chemical mechanical polishing (CMP). Although FIG. 2 only shows one via layer VIA0 142 and one line layer (M1 layer 152), this is only for ease of illustration and the device 100 may have many interconnect layers. For example, the interconnect structure 155 may have eight to 15 via layers and eight to 15 line layers. Although the conductive pattern layers are commonly referred to as "metal" layers, the conductive patterns may be formed of other conductive materials, such as polycrystalline silicon.

The first contact layer 130 and the contact structure 121, 131 are below a bottommost one of the interconnect via layers 142, and below a bottommost one of the interconnect pattern layers 152. Thus, because the contact layer 130 and contact structure 121, 131 are below the interconnect structure 155, the additional metal oxide metal capacitor formed by first pattern 130, second pattern 131 and dielectric 160 does not increase the thickness of the integrated circuit.

FIG. 3 shows a detail of the structure 100. To maximize the capacitance between the first patterns 130 and second patterns 131, the distance d between them is maintained at the minimum spacing for parallel lines, according to the design rules and technology file parameters for the technology node being used.

The side-wall capacitance for each unit having the elements shown in FIG. 2 electrode has two parts Cm0 and Cm1. The Cm0 sidewall capacitance is defined as the capacitance between the sidewalls of the M0 pattern layer, i.e., between the first pattern 130 and the second pattern 131. The Cm1 sidewall capacitance is defined as the capacitance between the sidewalls of the M1 interconnect layer (or another metal layer in which the MOM capacitor is located), i.e., between the third pattern (finger 250f) and the fourth pattern (finger 251f). In some embodiments, the Cm1 component is unaffected by the addition of the contact level Cm0 capacitance component, so that the capacitance increase equals Cm0.

The unit capacitance $C=\epsilon \cdot (A/d)$, where $\epsilon$ is the Permittivity of the dielectric, A is the area of the confronting portion of the sidewall, given by $A=H \cdot (Wg+Lend)$: and d is the distance between lines.

Unit Cm0=2 × (Cgate+Cend), for each MOSCAP finger, where

Cgate is the sidewall capacitance of the portion of patterns 130, 131 overlying the active area 110, given by Cgate=$\epsilon \cdot (d/[H \times Wg])$ Cend is the sidewall capacitance of the portion of patterns 130, 131 overlying the STI region 105, given by Cend=$\epsilon (d/[H \times Lend])$ For example, in a 20 nm process, the patterns 130, 131 have may a height H of 65 nm, and a distance between patterns 130 and 131 of 50 nm. With a relative permittivity of 4.4231, it is believed that the unit capacitance increase per electrode 120 due to the sidewall capacitance of patterns 130 and 131 is about 14%. Thus, the contact level MOM capacitor almost completely makes up for the capacitance reduction due to reduced "gate area density" in the electrode layer 120.

In the example of FIG. 1, the first metal layer (M1) patterns 150, 151 are provided for the purpose of providing interconnections. Pattern 150 interconnects the top electrodes 120 of the MOS capacitors and the first patterns 130 to each other; pattern 151 interconnects the second patterns 131 to each other. Thus, in FIG. 1, the spacing between the fingers 150f of pattern 150 and the fingers 151f of pattern 151 need not be optimized for providing capacitance between pattern 150 and pattern 151. In FIG. 1, the spacings between the fingers 150f and 151f need not all be the same as each other, and they need not be the minimum spacing permitted between adjacent lines.

Figure 4:
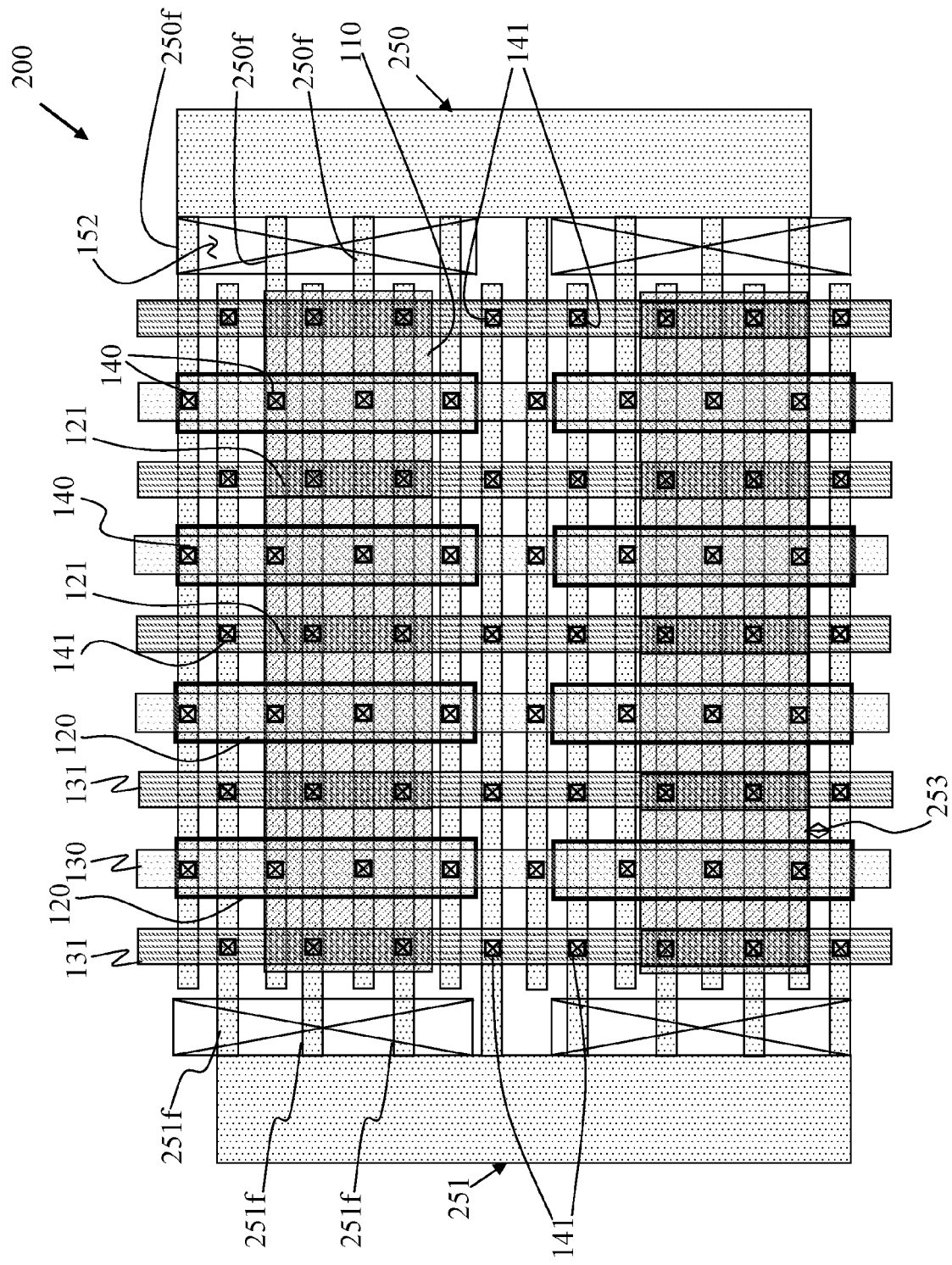
FIG. 4 is a plan view of a second embodiment of a MOS capacitor structure having a second integrated metal-oxide-metal capacitor in the M1 level.

In other embodiments, one or more additional MOM capacitors are provided in one or more of the interconnect conductive pattern (line) layers. FIG. 4 shows an example of a structure 200 in which an MOM capacitor 250, 251, 152 is provided in the M1 layer 152 or other conductive pattern (line) layer of the interconnect structure 155.

Like items in FIGS. 1 and 4 are indicated by like reference numerals. These include the active region 110, insulation layer 111, top electrode 120, M0 OD1 121, M0 PO 130, M0 OD2 131, vias 140 and vias 141. Descriptions of these like items are not repeated. In the M1 layer 152, the interconnect patterns 250, 251 are configured to provide an additional sidewall MOM capacitor. As in the case of FIG. 1, the pattern 250 interconnects all the top electrodes 120 and the first patterns 130 to each other. The fingers 251f of pattern 251 interconnects all of the second patterns 131 to each other. However, in FIG. 4, the number of fingers is maximized (by using minimum line width for the technology node), and the distance 253 between adjacent fingers is minimized for the technology used. Using the minimum spacing between each pair of adjacent fingers 250f, 251f maximizes the capacitance for that pair of fingers. Then, using the minimum line width maximizes the number of fingers, multiplying the sidewall capacitance by the number of adjacent pairs of fingers 250f, 251f. The IMD material 152 provides the dielectric for the MOM capacitor.

As shown in FIG. 4 one of the interconnect pattern layers (e.g., M1) comprises third elongated patterns 250f and fourth elongated patterns 251f arranged parallel to each other with additional dielectric material 152 therebetween so as to form the second side-wall MOM capacitor. The device has a plurality of conductive vias 140 connecting the first pattern 130 to the third pattern 250f, and a plurality of conductive vias 141 connecting the second pattern 131 to the fourth pattern 251f. The third patterns 250f and fourth patterns 251f extend in a second direction (left-right) perpendicular to the first direction (vertical) in which the first patterns 130 and second patterns 131 are arranged.

The M1 interconnect pattern layer comprises first and second comb structures 250, 251. Each comb structure 250, 251 has a plurality of fingers 250f, 251f. The first and second comb structures 250, 251 are arranged with respective fingers of each comb structure interleaved between and parallel to respective fingers of the other comb structure with additional dielectric material therebetween, so as to form a second sidewall capacitor. The vias 140 connect the first pattern 130 to the first comb structure 250, and the vias 141 connect the second pattern 131 to the second comb structure 251.

Figure 5:
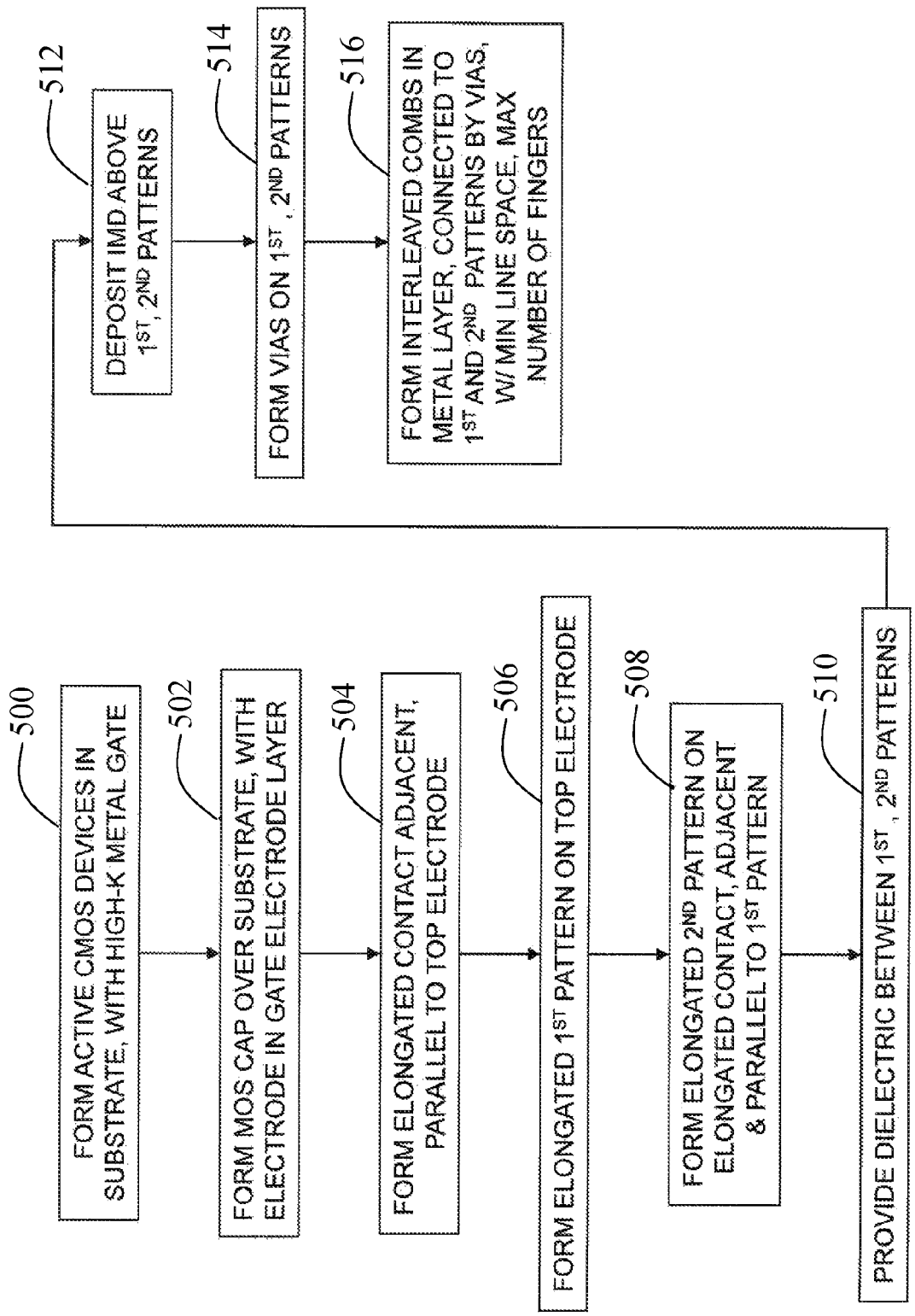
FIG. 5 is a flow chart of a method for forming a MOS capacitor with integrated parallel MOM capacitor at the contact level.

FIG. 5 is a flow chart of a method for forming a MOS capacitor with an integrated contact-level MOM capacitor connected in parallel.

A step 500, active devices are formed on the substrate using a complementary metal-oxide-semiconductor (CMOS) high-k metal gate process. The MOS capacitor is to be formed as part of this CMOS process. The CMOS process includes forming a high k gate insulation layer over the active region (OD) 110 of the substrate. The dielectric layer 111 of the MOS capacitor is to be formed in the same high k gate insulation layer as the gate insulation layer of transistors formed on the substrate by the CMOS process.

At step 502, the MOS capacitor is formed in the complementary metal-oxide-semiconductor (CMOS) process. The MOS capacitor has a top electrode 120 in the same gate electrode layer in which the gate electrodes of the transistors are formed.

At step 504, an elongated contact 121 is formed adjacent and parallel to the top electrode 120.

At step 506, an elongated first pattern 130 is formed in a contact layer on the top electrode 120.

At step 508, an elongated second pattern 131 is formed directly on the elongated contact 121, parallel to the first pattern 130 and at a same level as the first pattern (which is formed directly on the top electrode 120. the first pattern and the second pattern have approximately the same length as each other. The first and second patterns are formed before forming a first one of the conductive pattern layers (M1) of the interconnect structure, so that the first one of the conductive pattern layers of the interconnect structure will be above the first and second patterns.

At step 510, a dielectric material 160 is provided between the first pattern 130 and the second pattern 131, so as to form a first side-wall capacitor at the level of the contact layer, in parallel with the MOS capacitor.

At step 512, an inter-metal dielectric (IMD) layer is formed over the active devices, and over the first and second patterns 130, 131.

At step 514, conductive vias 140 are formed on the first patterns 130 for connecting a first comb structure (to be formed) to the first pattern. Also, conductive vias 141 are formed on the second pattern 131, for connecting the second comb structure (to be formed) to the second pattern 131.

At step 516, a side-wall capacitor 250, 152, 251 is formed in the first one of the conductive pattern layers (M1) of the interconnect structure. The side wall capacitor 250, 152, 251 is connected in parallel with the MOS capacitor 120, 111, 110. This step includes forming a first comb structure 250 having first fingers 250f and a second comb structure 251 having second fingers 251f, the first and second fingers interleaved with each other. The first fingers are perpendicular to the first pattern, and the second fingers are perpendicular to the second pattern. A second sidewall MOM capacitor is thus formed in parallel with the MOS capacitor.

Following formation of the MOM capacitor 250, 152, 251, the remainder of the interconnect structure is formed, having a plurality of IMD layers, containing horizontal conductive patterns and vertical conductive vias.

Although an example is provided in which the second sidewall MOM capacitor is formed in the M1 layer, the second sidewall MOM capacitor may be formed in any of the conductive pattern (metal) layers. Further, additional (e.g., third or fourth) sidewall MOM capacitors may be formed in any of the conductive pattern (metal) layers.

The various embodiments can increase the capacitance that can be achieved in a unit area and provides a design that is less susceptible to voltage change. These methods improve the layout patterns/structure by allowing regular routing of the electrode layer 120, contacts 121, 130, 131 and metal layers 150f, 151f.

The structures described above can easily accommodate high metal layer MOM capacitors (e.g., in one or more of layers M1 to M15).

In some embodiments, a device, comprises a substrate having at least one active region, an insulating layer above the substrate, and an electrode in a gate electrode layer above the insulating layer, forming a metal-oxide-semiconductor (MOS) capacitor. A first contact layer is provided on the electrode, having an elongated first pattern extending in a first direction parallel to the electrode. A contact structure contacts the substrate. The contact structure has an elongated second pattern extending parallel to the first pattern. A dielectric material is provided between the first and second patterns, so that the first and second patterns and dielectric material form a side-wall capacitor connected in parallel to the MOS capacitor.

In some embodiments, a device, comprises a substrate having at least one active region, an insulating layer above the substrate, and a plurality of electrodes in a gate electrode layer above the insulating layer, forming a metal-oxide-semiconductor (MOS) capacitor. A first contact layer has a plurality of elongated first patterns formed directly on respective ones of the electrodes. A contact structure has elongated second patterns extending parallel to the first patterns, and contact portions contacting the substrate. The contact portions extend parallel to the electrodes. A dielectric material is provided between the first and second patterns, so that the first and second patterns and dielectric material form a first side-wall capacitor connected in parallel to the MOS capacitor. At least one inter-metal dielectric (IMD) layer is above the first and second patterns, the IMD layer having conductive patterns above the first and second patterns.

In some embodiments, a method comprises forming a metal-oxide-semiconductor (MOS) capacitor over a substrate, the MOS capacitor having a top electrode in a gate electrode layer. An elongated contact is formed adjacent and parallel to the top electrode. An elongated first pattern is formed in a contact layer directly on the top electrode. An elongated second pattern is formed directly on the elongated contact, parallel to the first pattern and at a same level as the contact layer. A dielectric material is provided between the first pattern and the second pattern, so as to form a side-wall capacitor at the level of the contact layer, in parallel with the MOS capacitor.

Although the subject matter has been described in terms of exemplary embodiments, it is not limited thereto. Rather, the appended claims should be construed broadly, to include other variants and embodiments, which may be made by those skilled in the art.

What is claimed is:

1. A device, comprising:
a semiconductor substrate;
a gate electrode layer above the semiconductor substrate;
an interconnect structure above the gate electrode layer, the interconnect structure having one or more conductive pattern layers; and
at least one side-wall capacitor including a contact layer having a portion abutting the gate electrode layer, the at least one side-wall capacitor extending no lower than a lowest portion of the gate electrode layer and extending no higher than a highest portion of the contact layer.

2. The device of claim 1, wherein:
the substrate further comprises at least one shallow trench isolation (STI) region adjacent the device, and
the at least one side-wall capacitor has a length at least as long as a sum of a width of an active region over which an electrode is formed in the gate electrode layer and a width of the STI region.

3. The device of claim 1, wherein the at least one side-wall capacitor has an elongated contact portion contacting the substrate and extending parallel to an electrode in the gate electrode layer over an active region.

4. The device of claim 3, wherein the elongated contact portion has a length at least as long as a width of the active region.

5. The device of claim 3, wherein the side wall capacitor has elongated first and second patterns with dielectric material therebetween, the first pattern being formed on the electrode, the first pattern comprising copper or tungsten.

6. The device of claim 5, wherein the second pattern comprises copper.

7. The device of claim 3, wherein one of the conductive pattern layers of the interconnect structure comprises elongated third and fourth patterns arranged parallel to each other with additional dielectric material therebetween so as to form a second side-wall capacitor, the device further comprising:
a plurality of conductive vias connecting the first pattern to the third pattern, and connecting the second pattern to the fourth pattern.

8. The device of claim 7, wherein the third and fourth patterns extend in a direction perpendicular to a length direction of the first and second patterns.

9. The device of claim 7, wherein the third pattern is a first comb structure and the fourth pattern is a second comb structures, the first and second comb structures interleaved with each other, with additional dielectric material therebetween.

10. The device of claim 1, wherein the substrate includes a metal-oxide-semiconductor (MOS) capacitor having an electrode in the gate electrode layer, and the portion of the side wall capacitor abuts the electrode of the MOS capacitor.

11. A device, comprising:
a semiconductor substrate having an active area;

an electrode in a gate electrode layer above the semiconductor substrate;

an interconnect structure above the gate electrode layer, the interconnect structure having one or more conductive pattern layers; and at least one side-wall capacitor including a contact layer having a portion abutting the electrode in the active area, the at least one side-wall capacitor extending no lower than a lowest portion of the gate electrode layer and extending no higher than a highest portion of the contact layer, the at least one side wall capacitor having a length greater than a width of the active area.

12. The device of claim 11, wherein the side-wall capacitor includes:

a first elongated pattern formed in the contact layer, abutting the electrode;

a second elongated pattern formed at the level of the contact layer, parallel to the first elongated pattern;

a contact directly contacting the semiconductor substrate and the second elongated pattern; and a dielectric material between the first and second elongated patterns.

13. The device of claim 12, wherein the contact has a length at least as long as the width of the active region.

14. The device of claim 12, wherein the electrode comprises a metal material;

the contact comprises tungsten;

the first elongated pattern comprises one of the group consisting of copper and tungsten; and the second elongated pattern comprises copper.

15. The device of claim 12, wherein:

the substrate further comprises at least one shallow trench isolation (STI) region adjacent the active region, and the first pattern and second pattern have a length at least as long as a sum of a width of the active region and a width of the STI region.

16. The device of claim 11, further comprising an insulating layer between the substrate and the electrode, the electrode and insulating layer being part of a a metal-oxide-semiconductor (MOS) capacitor.

17. A device, comprising:

a semiconductor substrate having an active area;

an electrode in a gate electrode layer above the semiconductor substrate;

an interconnect structure above the gate electrode layer, the interconnect structure having one or more conductive pattern layers; and at least one side-wall capacitor comprising:

a first elongated pattern formed in a contact layer, abutting the electrode;

a second elongated pattern formed at the level of the contact layer, parallel to the first elongated pattern; and a dielectric material between the first and second elongated patterns;

wherein the at least one side-wall capacitor extends no lower than a lowest portion of the gate electrode layer and extends no higher than a highest portion of the contact layer.

18. The device of claim 17, wherein one of the conductive pattern layers of the interconnect structure comprises elongated third and fourth patterns arranged parallel to each other with additional dielectric material therebetween so as to form a second side-wall capacitor, the device further comprising:

a plurality of conductive vias connecting the first pattern to the third pattern, and connecting the second pattern to the fourth pattern.

19. The device of claim 18 further comprising an insulating layer between the substrate and the electrode, the electrode and insulating layer being part of a a metal-oxide-semiconductor (MOS) capacitor.

* * * * *